United States Patent
Clarkson

(10) Patent No.: US 8,471,567 B2
(45) Date of Patent: Jun. 25, 2013

(54) CIRCUIT FOR DETECTION OF FAILED SOLDER-JOINTS ON ARRAY PACKAGES

(75) Inventor: Robert R. Clarkson, Garland, TX (US)

(73) Assignee: Raytheon Company, Waltham, MA (US)

( * ) Notice: Subject to any disclaimer, the term of this patent is extended or adjusted under 35 U.S.C. 154(b) by 342 days.

(21) Appl. No.: 13/035,362

(22) Filed: Feb. 25, 2011

(65) Prior Publication Data

US 2012/0217976 A1 Aug. 30, 2012

(51) Int. Cl.
*G01R 31/04* (2006.01)
*G01R 31/08* (2006.01)

(52) U.S. Cl.
USPC ........... 324/538; 324/522; 324/525; 324/527; 324/537

(58) Field of Classification Search
USPC .............. 324/538, 537, 500, 522, 525, 527, 324/555, 713, 691, 649, 600, 763.01, 719; 438/17
See application file for complete search history.

(56) References Cited

U.S. PATENT DOCUMENTS

| | | | |
|---|---|---|---|
| 7,196,294 B2 | 3/2007 | Hofmeister et al. | |
| 7,501,832 B2 * | 3/2009 | Spuhler et al. | 324/537 |
| 7,880,485 B2 * | 2/2011 | Nakamura | 324/705 |
| 2006/0194353 A1 | 8/2006 | Spuhler et al. | |
| 2007/0216427 A1 | 9/2007 | Barton | |
| 2008/0144243 A1 | 6/2008 | Mariani et al. | |
| 2009/0160457 A1 * | 6/2009 | Spuhler et al. | 324/537 |

OTHER PUBLICATIONS

Spartan-3 Generation FPGA User Guide, Chapter 10, "Using I/O Resources", UG331 (v1.5), www.xilinx.com, Jan. 21, 2009 (pp. 311-313, 330-332).

* cited by examiner

*Primary Examiner* — Hoai-An D Nguyen
(74) *Attorney, Agent, or Firm* — Christie, Parker & Hale, LLP

(57) ABSTRACT

A circuit for detecting changes in resistance at a solder joint connecting a constant voltage source supplying a first voltage and a pin of an array package during operation of the array package includes: a test circuit for applying a second voltage different from the first voltage at a side of the solder joint opposite the constant voltage source; and a monitoring circuit for monitoring an output of the test circuit, wherein the test circuit is configured to output the first voltage when the resistance at the solder joint is below a threshold value, and to output a voltage other than the first voltage when the resistance at the solder joint is above the threshold value, and wherein the monitoring circuit is configured to indicate a failure of the solder joint connection when the voltage other than the first voltage is output by the test circuit.

16 Claims, 4 Drawing Sheets

CIRCUIT FOR DETECTION OF FAILED SOLDER-JOINTS ON ARRAY PACKAGES

BACKGROUND OF THE INVENTION

1. Field of the Invention

The present invention relates generally to a circuit for testing array packages, and more particularly, to a circuit for more readily detecting failures of solder joints on array packages.

2. Description of Related Art

Large array packages used for implementing integrated circuits or programmable logic devices, such as field programmable gate arrays (FPGAs), are commonly employed in digital electronics and electronic systems. Often, these array packages are electrically and mechanically coupled to, for example, circuit boards or circuit cards and other associated components, through various solder joint connections associated with, for example, a ball grid array.

The solder joint connections between the array package and the circuit board can fail over time due to mechanical fatigue. Such mechanical fatigue can be caused, for example, by repeated vibration of the electronic system during operation, or by repeated thermal cycles when the array package has a different coefficient of thermal expansion and/or changes temperatures faster or slower than the circuit board during operation. When one or more of the solder joints fails, the system may not be able to function properly.

Previous testing procedures for detecting failed or failing solder joints have been used, but are too costly, overly complex to implement, or both. In addition, some testing procedures identify failures only when a complete disconnect occurs. Some other testing procedures require the operation of the array package or the circuit to be interrupted or stopped.

SUMMARY OF THE INVENTION

Exemplary embodiments of the present invention provide a circuit for more readily detecting failures of solder joints associated with array packages.

In an exemplary embodiment, a circuit for detecting changes in resistance at a solder joint connecting a constant voltage source supplying a first voltage and a pin of an array package during operation of the array package includes: a test circuit for applying a second voltage different from the first voltage at a side of the solder joint opposite the constant voltage source; and a monitoring circuit for monitoring an output of the test circuit, wherein the test circuit is configured to output the first voltage when the resistance at the solder joint is below a threshold value, and to output a voltage other than the first voltage when the resistance at the solder joint is above the threshold value, and wherein the monitoring circuit is configured to indicate a failure of the solder joint connection when the voltage other than the first voltage is output by the test circuit.

The monitoring circuit may be configured to perform a logic level change to indicate the failure of the solder joint connection when the voltage other than the first voltage is output by the test circuit, wherein the voltage other than the first voltage is any voltage above a first threshold voltage that is greater than the first voltage or any voltage below a second threshold voltage that is less than the first voltage.

The pin may be located near a corner of the array package.

The pin may include an input-output block of the array package including the test circuit.

The first voltage may be ground and the test circuit may include a pull-up resistor connecting the second voltage to the pin, wherein when the resistance at the solder joint is at the threshold value, the resistance at the solder joint is at a first ratio with respect to a resistance of the pull-up resistor, and the output of the test circuit is configured to change from ground to the voltage other than the first voltage when the resistance at the solder joint is greater than the threshold value.

The first voltage may be ground, the test circuit may include a test pulse output driver, and the second voltage may be supplied as a periodic test pulse, wherein when the resistance at the solder joint is above the threshold value, the test pulse is configured to change the output of the test circuit from ground to the voltage other than the first voltage. The test pulse output driver may include a circuit for limiting a duty cycle of the test pulse to reduce stress on the test pulse output driver. The test pulse output driver may include: an asynchronous delay for delaying a clock signal; an inverter for inverting the delayed clock signal; a NAND gate for receiving the clock signal and the delayed inverted clock signal; and a tri-state controller for outputting the test pulse corresponding to an output from the NAND gate. The test circuit may further include an additional pull-up resistor connecting a constant voltage source at the second voltage to the pin. A duration of the test pulse may be about 3 nanoseconds.

The pin may be a first pin configured to supply the first voltage to the array package, wherein a second pin connected to the first pin includes an input-output block of the array package including the test circuit.

The first pin may be located near a corner of the array package, and the second pin may be located farther from the corner than the first pin.

The first pin may include a ground pin coupled to a ground connection of the array package, and the test circuit may include a pull-up resistor connecting the second voltage to the second pin, wherein when the resistance at the solder joint is at the threshold value, the resistance at the solder joint is at a first ratio with respect to a resistance of the pull-up resistor, and the output of the test circuit is configured to change from ground to the voltage other than the first voltage when the resistance at the solder joint is greater than the threshold value. The test circuit may further include an additional pull-up resistor connecting the second voltage to a trace between the first pin and the second pin.

The first pin may include a power pin coupled to a power connection of the array package, and the test circuit may include a pull-down resistor connecting the second voltage to the second pin, wherein when the resistance at the solder joint is at the threshold value, the resistance at the solder joint is at a first ratio with respect to a resistance of the pull-down resistor, and the output of the test circuit is configured to change from a voltage of the power connection to the voltage other than the first voltage when the resistance at the solder joint is greater than the threshold value. The pull-down resistor may connect the second voltage to the second pin via a trace between the first pin and the second pin.

BRIEF DESCRIPTION OF THE DRAWINGS

The accompanying drawings, together with the specification, illustrate exemplary embodiments of the present invention, and, together with the description, serve to explain the principles of the present invention, of which.

DETAILED DESCRIPTION OF THE INVENTION

Figure 1A:
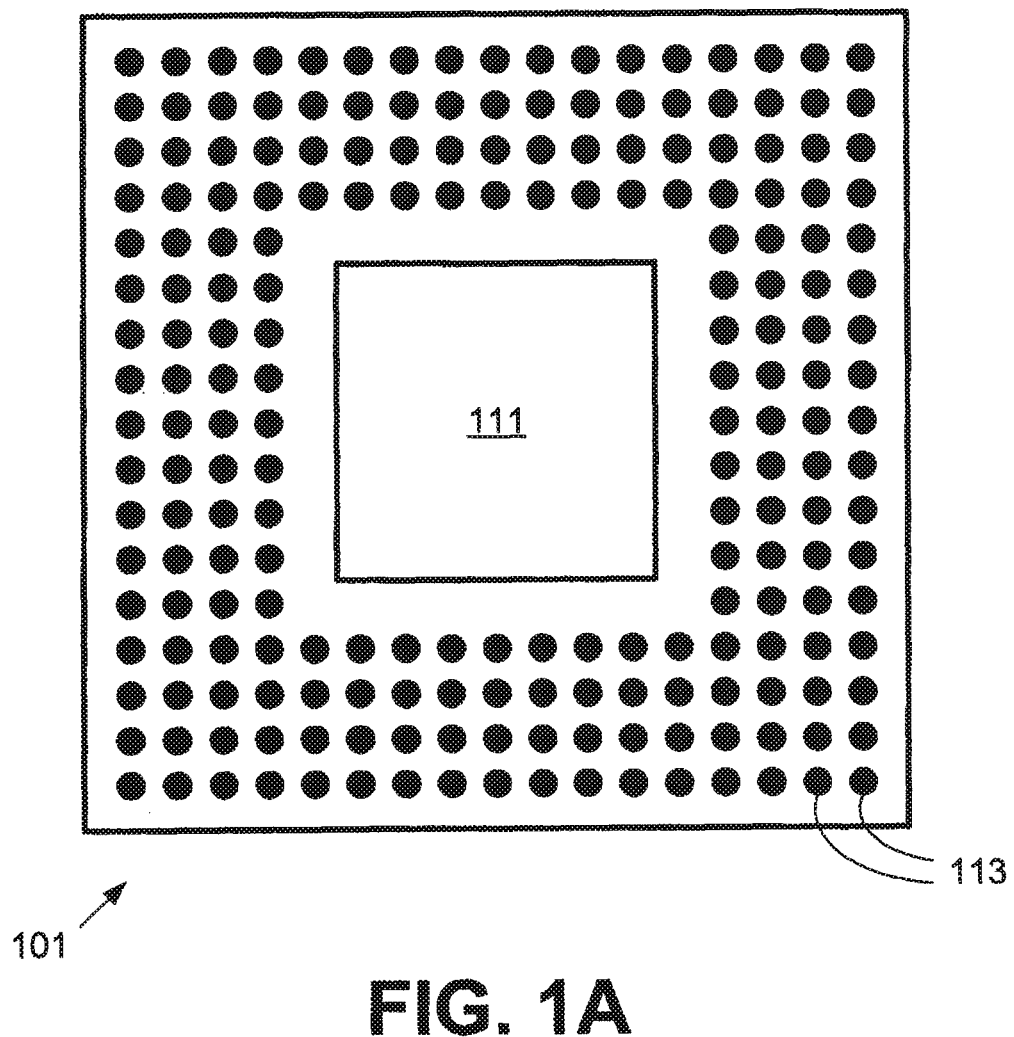
FIGS. 1A and 1B are illustrations of an array package in the form of a ball grid array in accordance with aspects of an embodiment of the invention.

Hereinafter, certain exemplary embodiments according to the present invention will be described with reference to the accompanying drawings. Some of the elements that are not essential to the complete understanding of the present invention are omitted for clarity. In addition, similar elements that appear in different drawings may be referred to by using the same reference numerals.

Solder joints connecting array packages, such as ball grid arrays and the like, to circuit boards, for example, can fail due to many factors, such as mechanical fatigue from vibration or repeated thermal cycles. When a solder joint for an array package fails, the circuit may no longer function properly. Typically, more mechanical stress is exerted on solder joints at or around the corners of an array package, causing them to fail first. Therefore, corner pins of an array package are generally not utilized for critical or more important circuitry. However, a circuit for detecting solder joint failures can be applied at the corner pins for early detection of a solder joint failure. In this manner, when a failure of a corner solder joint is detected, the circuit can be repaired or replaced before the failure of any of the interior solder joints, which may be utilized for more important circuitry, occurs.

Figure 1B:
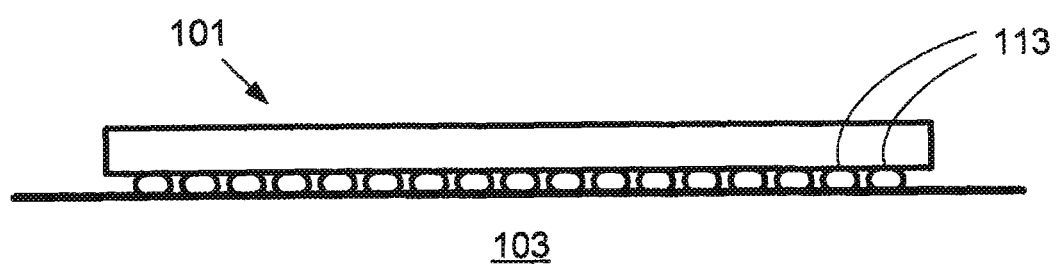

FIG. 1A is an illustration of one side of a ball grid array in accordance with aspects of an embodiment of the invention, and FIG. 1B is an illustration of a side view of the ball grid array package connected to a circuit board in accordance with aspects of an embodiment of the invention. The array package 101 in FIGS. 1A and 1B may be a schematic representation of for example, a field programmable gate array (FPGA) and associated ball grid array, to which a circuit and method for detecting solder joint failures according to aspects of embodiments of the present invention may be applied. The array package 101 includes a chip 111 attached to a ball grid array having multiple input/output (I/O) pins 113, which may be realized as an array of solder balls. The I/O pins 113 of the array package 101 are generally soldered to a circuit board 103 prior to operation, as schematically illustrated in, for example, FIG. 1B. In other embodiments, the detection circuit and method may also be applied to various different electronic packages, which may be connected to a circuit board or similar device via soldering, wire bonding, or various other mounting methods.

As discussed above, on large array packages similar to array package 101 in FIG. 1, solder joints connecting the I/O pins 113 at the corners of the array package 101 typically fail first. Therefore, corner pins on large array packages are often not utilized for critical circuit connections. Furthermore, the failing of corner joints on an array package may foreshadow or indicate imminent failure of adjacent interior joints. Therefore, monitoring of corner joints and detecting corner joint failures may be useful in determining whether to service or replace the circuit prior to the failure of other interior solder joints that may be more critical to the functionality of the circuit.

Figure 2:
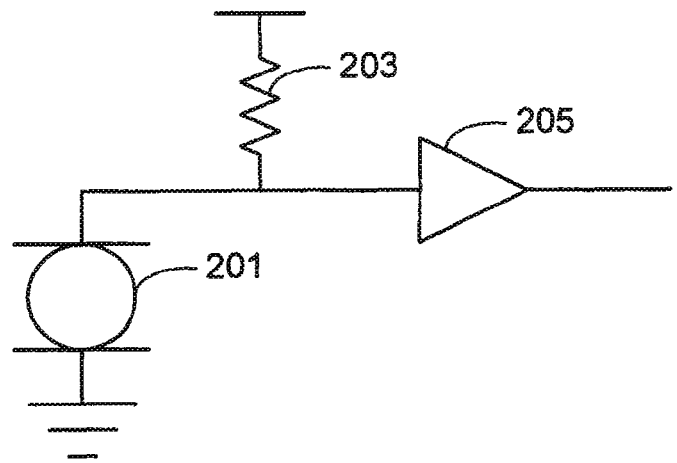
FIG. 2 is a schematic circuit diagram illustrating a configuration between an I/O pin located at or near a corner of an array package and a circuit board according to an embodiment of the present invention.

FIG. 2 is a schematic circuit diagram illustrating a configuration between an I/O pin located at or near a corner of an array package and a circuit board according to an embodiment of the present invention. In the embodiment of FIG. 2, a connection between the corner I/O pin and the circuit board includes a solder joint connection 201, a pull-up resistor 203, and a buffer 205.

In one embodiment, each of the corner I/O pins of an array package is connected to ground on the circuit board via, for example, a solder joint connection 201. The array package may be configured to assign an internal programmable pull-up resister 203 to each of the I/O pins. The I/O pin may further be buffered 205, with the resulting signal sent to a monitoring circuit which, in some embodiments, may be included in the array package. Generally, each I/O pin being monitored will have its own latch. In this manner, the I/O pins can be individually monitored, and a solder joint failure can more readily be identified. However, in embodiments where, for example, information regarding a general failure is more critical than determining exactly which solder joint has failed, signals from some or all of the I/O pins being monitored may be coupled to an OR gate and connected to a single latch, whereby an associated monitoring circuit detects failures at any of the corresponding solder joints.

In operation, a voltage at the I/O pin remains at ground so long as the solder joint remains intact and does not fail. Meanwhile, the pull-up resistor 203 continuously attempts to pull up the voltage at the I/O pin. Therefore, the instant the connection at the solder joint breaks or becomes disconnected, the pull-up resistor 203 pulls the voltage at the I/O pin high, and the high signal indicates that a failure has occurred at the solder joint. The rate that the voltage at the I/O pin is raised corresponds to the parasitic capacitance of the internal component trace. For example, the R-C time constant with an input capacitance of 3 pf and a 25 KΩ pull-up resistor is only 75 nanoseconds. Furthermore, typical power dissipation is only about 0.25 mW. Therefore, solder joint failures are detected with fast response times under this approach, while additional power consumption is low.

Some array packages are configured such that corner pins are assigned by the manufacturer to be power or ground, and cannot be programmed as I/O pins. A modified version of the detection circuit and method according to embodiments of the present invention may also be applied in these instances. For example, a trace can be run from a corner ground pin to an adjacent or nearby I/O pin, whereby the nearby I/O pin is configured as described above. When the solder joint at the corner ground pin is disconnected or broken, the trace would no longer be grounded, and the internal pull-up resistor at the corresponding I/O pin pulls the voltage high, indicating a failure at the solder joint at the corner ground pin.

Figure 3:
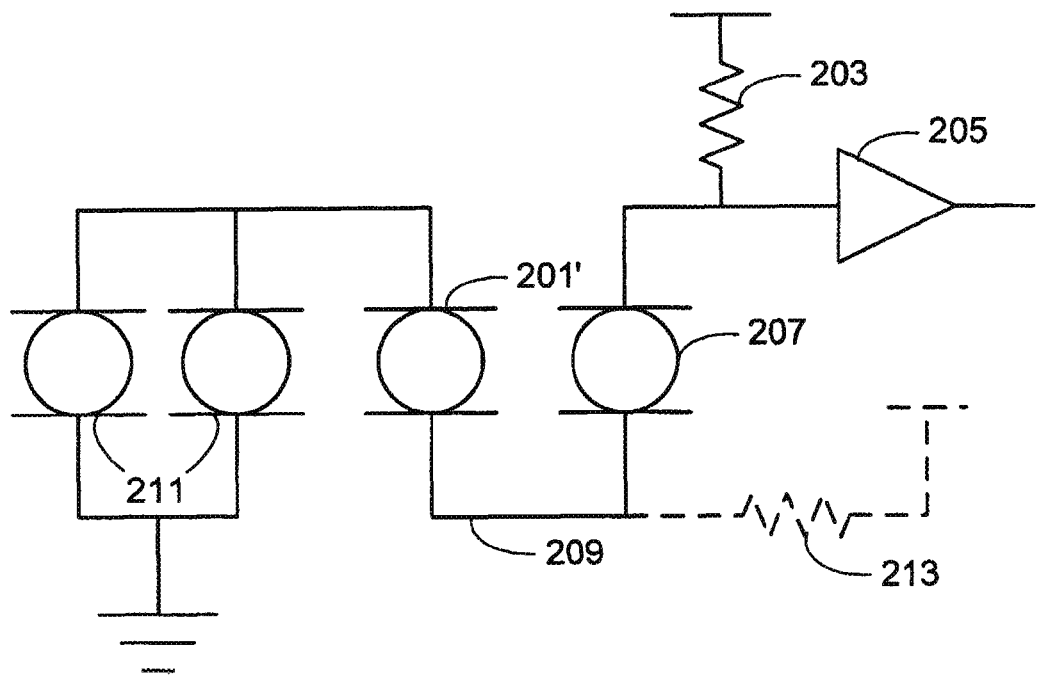
FIG. 3 is a schematic circuit diagram illustrating a configuration between a ground pin located at or near a corner of an array package and a circuit board according to another embodiment of the present invention.

For example, FIG. 3 is a schematic circuit diagram illustrating a configuration between a ground pin located at or near a corner of an array package and a circuit board according to another embodiment of the present invention. In the embodiment of FIG. 3, an arrangement for monitoring a corner solder joint connection includes the solder joint connection at the corner ground pin 201', a pull-up resistor 203, a buffer 205, a solder joint connection at an I/O pin 207, a circuit board trace 209 connecting the solder joint connections 201' and 207, and additional solder joint connections 211 at additional ground pins.

In one embodiment, a ground pin located at or near a corner of an array package is connected to an I/O pin of the array package, where the I/O pin is utilized to monitor the corner ground pin. In the embodiment of FIG. 3, the corner ground pin is not connected to ground on the circuit board. Instead, the solder joint connection 201' connects the corner ground pin to a trace 209 on the circuit board which is also connected to the I/O pin via another solder joint connection 207. In this manner, the I/O pin and the corner ground pin communicate with each other. The I/O pin is configured similarly to the I/O pin described with respect to FIG. 2. That is, the array package may be configured to assign an internal programmable pull-up resistor 203 to the I/O pin, and the I/O pin may further be buffered 205, with the resulting signal sent to a latch. Other ground pins in the quadrant or region of the array package may be connected to ground on the circuit board via additional solder joint connections 211. Since the ground pins are generally connected together in the array package, the corner ground pin, as well as the I/O pin, will be connected to ground on the circuit board through the other ground pins, so long as the solder joint connections remain intact.

In operation, a voltage at the I/O pin remains at ground so long as each of the solder joints 201', 207 for the corner ground pin and the I/O pin, respectively, remains intact and does not fail. The corner ground pin in this configuration only serves as a ground to the I/O pin connected to the trace 209, which is reserved for monitoring the solder joint 201' at the corner ground pin. Therefore, when the solder joint connection at either the corner ground pin or the I/0 pin breaks or becomes disconnected, the pull-up resistor 203 pulls the voltage at the I/0 pin high, and the high signal indicates that a failure has occurred. Since the corner joints in an array package typically fail first, a high signal typically indicates that the solder joint 201' at the corner ground pin has failed. However, in this embodiment, if the solder joint 207 at the I/O pin fails, a high signal also occurs.

In some embodiments, the connection between the corner ground pin and the I/O pin can be connected to an external pull-up resistor 213, for example, through an additional trace on the circuit board connected to trace 209. In these embodiments, the external pull-up resistor 213 may be added to parallel the internal pull-up resistor 203 to improve detection of failed solder joints at the expense of increased power consumption. The additional power is consumed by the external resistor 213, and avoids or reduces additional power dissipation and heat to the array package. However, while external pull-up resistor 213 can be used to supplement the internal pull-up resistor 203, in many such embodiments, it does not replace the internal pull-up resistor 203. If only the external pull-up resistor 213 is utilized, such a configuration would be able to detect only a failure at the solder joint 201' connecting the corner ground pin, but would not be able to detect a failure at the solder joint 207 connecting the I/O pin, or any subsequent failures at the solder joint 201' connecting the corner ground pin that occur after the I/O pin has been disconnected. Therefore, in embodiments where an internal pull-up resistor 203 is not used, it may be desirable to use an I/O pin farther away from the corners of the array package, to reduce the possibility that a failure of solder joint 207 for the I/O pin will occur before a failure of solder joint 201' for the corner ground pin.

In the embodiments of FIG. 3, since the corner ground pin cannot monitor itself, a second pin that is an I/O pin and an additional trace are utilized to monitor the corner ground pin. However, in this embodiment, response times remain high and additional power consumption remains low, while only minimal additional space on the circuit board is used.

Figure 4:
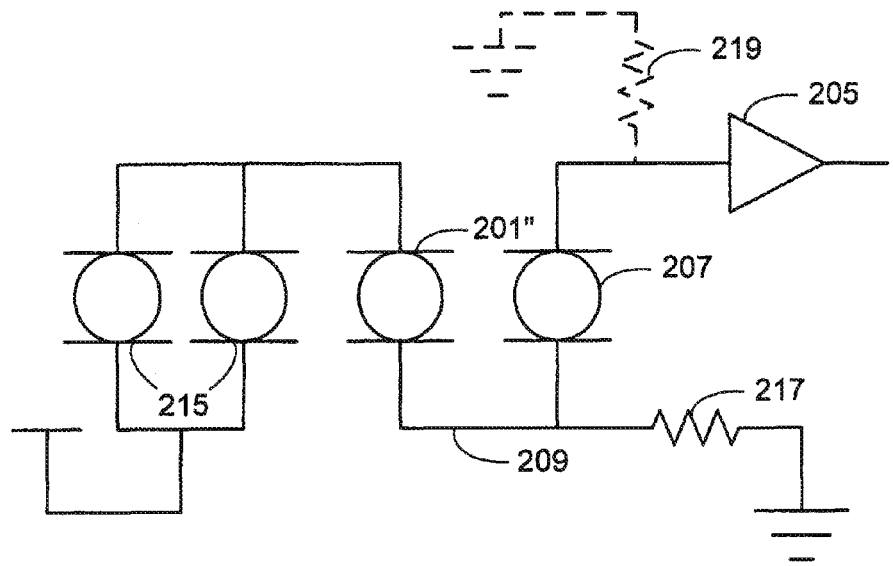
FIG. 4 is a schematic circuit diagram illustrating a configuration between a power connection pin located at or near a corner of an array package and a circuit board according to another embodiment of the present invention.

When the corner solder joint of an array package is defined as a power connection for a particular pin-out, the monitoring configurations, for example as described with respect to FIG. 3, can still be used with minor modifications. For example, FIG. 4 is a schematic circuit diagram illustrating a configuration between a power connection pin located at or near a corner of an array package and a circuit board according to another embodiment of the present invention. In the embodiment of FIG. 4, another arrangement for monitoring a corner solder joint connection includes the power connection pin for the corner solder joint 201", a buffer 205, a solder joint connection at an I/O pin 207, a circuit board trace 209 connecting the solder joint connections 201" and 207, a pull-down resistor 217, and additional solder joint connections 215 for additional power connection pins for the array package. Note that this arrangement is similar to the arrangement described with respect to corner ground pins in FIG. 3.

In one embodiment, a power connection pin located at or near a corner of an array package is connected to an I/O pin of the array package, where the I/O pin is utilized to monitor the corner power connection pin. Here, the corner power connection pin is not connected to a power connection on the circuit board, but is instead connected to the I/O pin via a solder joint 201" associated with the power connection pin, a trace 209 on the circuit board, and a solder joint connection 207 for the I/O pin, such that the corner power connection pin and the I/O pin communicate with each other. Other power connection pins in the region of the array package may be connected to a power connection on the circuit board via additional solder joint connections 215. Since the power pins are generally connected together in the array package, the corner power connection pin, as well as the I/O pin, will be connected to a power connection on the circuit board through the other power connection pins, so long as the solder joint connections remain intact.

The array package in different embodiments may or may not support an internal pull-down resistor. In embodiments where the array package supports an internal pull-down resistor, the array package may be configured to assign the internal programmable pull-down resistor 219 to the I/O pin. The I/O pin may further be buffered 205, with the resulting signal sent to a latch. In these embodiments, an additional external pull-down resistor 217 may also be implemented. In embodiments where the array package does not support an internal pull-down resistor, the external pull-down resister 217 may instead be used.

Operation of the embodiment of FIG. 4 is similar to operation described above with respect to FIG. 3. That is, a voltage at the I/O pin remains high when each of the solder joints 201", 207 for the corner power connection pin and the I/O pin, respectively, remains intact and does not fail. The corner power connection pin is only utilized to connect the I/O pin connected to the trace 209 to power. The I/O pin is, in turn, reserved for monitoring the solder joint 201" at the corner power connection pin. In embodiments including an internal pull-down resistor 219, when the solder joint connection at either the corner power connection pin or the I/O pin breaks or becomes disconnected, the internal pull-down resistor 219 pulls the voltage at the I/O pin low, and the low signal indicates that a failure has occurred at either solder joint connection 201" or 207. In embodiments without an internal pull-down resistor 219, and instead employing an external pull-down resistor 217 through, for example, an additional trace on the circuit board connected to trace 209. Similarly as discussed in reference to the embodiments of FIG. 3, embodiments using only an external pull-down resistor 217 without an internal pull-down resistor 219 are able to detect a failure only at the solder joint 201" connecting the corner power connection pin, but may not detect a failure at the solder joint 207 connecting the I/O pin, or any subsequent failures at the solder joint 201" connecting the corner power connection pin that occur after the I/O pin has been disconnected. Therefore, in embodiments where an internal pull-down resistor 217 is not available or is not utilized, it may be desirable to use an I/O pin farther away from the corners of the array package, to reduce the possibility that a failure of solder joint 207 for the I/O pin will occur before a failure of solder joint 201" for the corner power connection pin.

Figure 5:
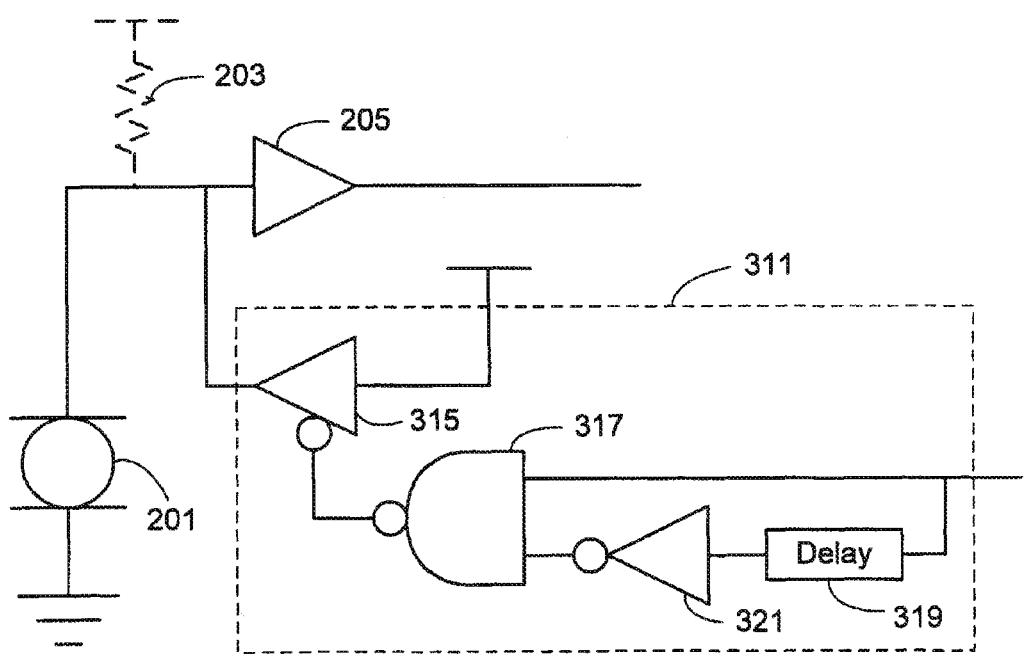
FIG. 5 is a schematic circuit diagram illustrating a configuration between an I/O pin located at or near a corner of an array package and a circuit board according to another embodiment of the present invention which applies a test pulse to the I/O pin.

In the above embodiments, a fault may only be detected when the joint resistance exceeds the resistance of the pull-up or pull-down resistor implemented. Generally, in the case where a typical 25 KΩ weak pull-up resistor is used, only complete disconnects can be detected. To detect eminent failures where the resistance of a failing joint may be less than 100Ω, a weak pull-up resistor can be augmented or replaced with a periodic test pulse applied to the corner I/O pin. FIG. 5 is a schematic circuit diagram illustrating a configuration between an I/O pin located at or near a corner of an array package and a circuit board according to another embodiment of the present invention which applies a test pulse to the I/O pin. In the embodiment of FIG. 5, a connection between the corner I/O $_p$in and the circuit board includes a solder joint connection 201, a buffer 205, and a test pulse output driver 311. The test pulse output driver 311 may be a simple circuit including, for example, a tri-state buffer control 315, a NAND gate 317, an asynchronous delay 319, and an inverter 321. In some embodiments, an internal pull-up resistor 203 similar to the internal pull-up resistor 203 discussed in previous embodiments may still be included.

In one embodiment, an I/O pin located at or near a corner of an array package is connected to ground on the circuit board via, for example, the solder joint connection 201. The test pulse output driver 311 may be programmed or implemented with components from the array package. That is, the array package can be programmed to perform the functions of the test pulse output driver 311 or a similar test pulse generator. In some embodiments, the test pulse output driver 311 may be implemented with components outside of the array package. In some embodiments, a separate test pulse output driver 311 is assigned to each corner, so that it will be easier to identify at which corner a failure occurs. In other embodiments where, for example, information regarding general failures are desired, or where it is difficult or inefficient to implement or program multiple test pulse output drivers 311 in the array package, a single test pulse output driver 311 may be shared by all the corner I/O pins or any additional pins which are to be monitored.

In operation, a voltage at the corner I/0 pin remains at ground, so long as the solder joint 201 remains intact and does not disconnect or fail. In the test pulse output driver 311, a clock signal is asynchronously delayed 319 and inverted 321, and the original clock signal and the delayed and inverted clock signal are input to the NAND gate 317. The output of the NAND gate 317 is input to a tri-state buffer 315 with an active-low control. Therefore, a test pulse is generated when the NAND gate outputs a low signal, with a duration corresponding to the asynchronous delay of the clock signal. In this manner, the test pulse output driver 311 can apply narrow periodic test pulses at the I/O pin. The test pulse output driver 311 can configure the test pulses to be brief, on the order of about 2 to 3 nanoseconds in one embodiment, to conserve power and to prevent stress on the circuit. Furthermore, if an asynchronous delay is used, a clock failure does not cause the test pulse output driver to be inadvertently left in an on state.

Figure 6:
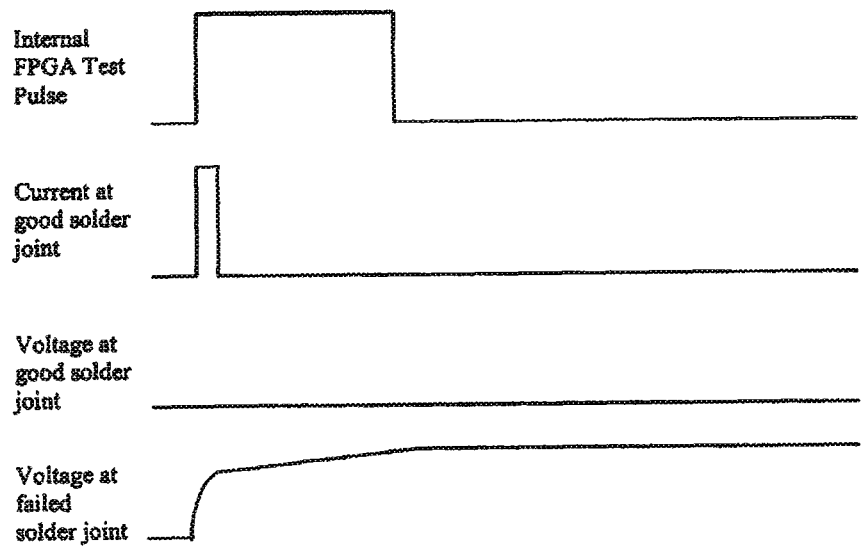
FIG. 6 is a timing diagram illustrating expected voltages on both a good solder joint and a failed solder joint when a test pulse is applied to the joint.
Figure 7:
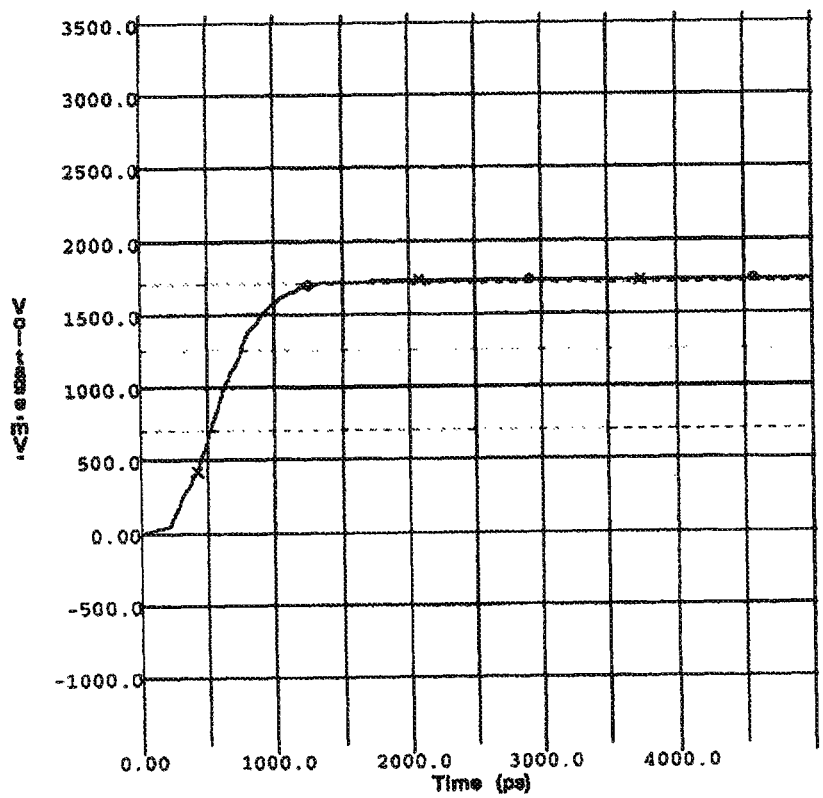
FIG. 7 is a graph of a simulation result showing fault detection at a corner I/O pin.

FIG. 6 is a timing diagram illustrating expected voltages on both a good solder joint and a failed solder joint when a test pulse is applied to the joint. Referring to FIG. 6, a test pulse is applied, in some embodiments, for a duration of about 2 to 3 nanoseconds. The test pulse creates a brief current pulse through the corner I/O pin. If the solder joint is intact and has not failed, the ground connection keeps the I/O pin at a low voltage. However, if the solder joint is disconnected or has failed in any other manner, where the resistance of a failing joint is above a threshold resistance level, a voltage appears across the joint that exceeds the logic threshold for the input gate, the voltage at the I/O pin is pulled high, and a fault is detected. FIG. 7 is a graph of a simulation result showing fault detection at a corner I/O pin, where the voltage at the I/O pin is pulled high and a fault is detected within a few nanoseconds of application of a test pulse. In embodiments using a test pulse similarly as described above, minute or eminent failures where a resistance change of a failing joint is less than 30 can be detectable.

In exemplary embodiments of the present invention, a circuit and method for detecting failed solder joints connecting I/O pins of array packages with circuit boards can be performed with greater detection sensitivity and at faster speeds. In addition, in some embodiments, the detection circuit utilizes only a single I/O pin, making available a greater number of I/O pins on the array package for other functions. In some embodiments, the circuit is applied to corner I/O pins or I/O pins near the corners of the array package, while in other embodiments, the circuit can be applied to any other I/O pins where monitoring is desired. The detection circuit and method according to embodiments of the present invention are capable of detecting minute resistance changes in the I/O pins being monitored, well before a complete failure or disconnect occurs, so that repair or replacement can be performed prior to a critical failure. Monitoring is continuous and uses minimal resources, minimal power, and a minimal number of I/O pins. The circuit according to embodiments of the present invention can also be applied to power and/or ground pins which may be assigned to corners of some array packages.

Further modifications of the described embodiments may also be possible, for example, for improving performance during manufacture, testing, and/or operation. For example, a location may be provided on a circuit board or card for a low value resistor to be connected in series with a solder joint connection 201/201'/201" under test with respect to a detection circuit. Addition of such a resistor could be between solder joint connection 201 and ground in FIGS. 2 and 5, or in series along circuit board trace 209 in FIGS. 3 and 4. In this manner, selection of particular resistance values for the resistor can assist in testing threshold values and improving sensitivity of the detection circuit by reducing a resistance value or change at the solder joint that will trigger a failure detection. Some such modifications may be incorporated into a final product, or may only be implemented during manufacture and/or testing, based on usage of the particular modification.

While the present invention has been described in connection with certain exemplary embodiments, it is to be understood that the invention is not limited to the disclosed embodiments, but is intended to cover various modifications and equivalent arrangements included within the spirit and scope of the appended claims, and equivalents thereof.

What is claimed is:

1. A circuit for detecting changes in resistance at a solder joint connecting a constant voltage source supplying a first voltage and a pin of an array package during operation of the array package, the circuit comprising:
a test circuit for applying a second voltage different from the first voltage at a side of the solder joint opposite the constant voltage source; and
a monitoring circuit for monitoring an output of the test circuit,
wherein the test circuit is configured to output the first voltage when the resistance at the solder joint is below a threshold value, and to output a voltage other than the first voltage when the resistance at the solder joint is above the threshold value, and
wherein the monitoring circuit is configured to indicate a failure of the solder joint connection when the voltage other than the first voltage is output by the test circuit.

2. The circuit of claim 1, wherein the monitoring circuit is configured to perform a logic level change to indicate the failure of the solder joint connection when the voltage other than the first voltage is output by the test circuit, and wherein the voltage other than the first voltage is any voltage above a first threshold voltage that is greater than the first voltage or any voltage below a second threshold voltage that is less than the first voltage.

3. The circuit of claim 1, wherein the pin is located near a corner of the array package.

4. The circuit of claim 1, wherein the pin comprises an input-output block of the array package comprising the test circuit.

5. The circuit of claim 4, wherein the first voltage is ground and the test circuit comprises a pull-up resistor connecting the second voltage to the pin, and wherein when the resistance at the solder joint is at the threshold value, the resistance at the solder joint is at a first ratio with respect to a resistance of the pull-up resistor, and the output of the test circuit is configured to change from ground to the voltage other than the first voltage when the resistance at the solder joint is greater than the threshold value.

6. The circuit of claim 4, wherein the first voltage is ground, the test circuit comprises a test pulse output driver, and the second voltage is supplied as a periodic test pulse, and wherein when the resistance at the solder joint is above the threshold value, the test pulse is configured to change the output of the test circuit from ground to the voltage other than the first voltage.

7. The circuit of claim 6, wherein the test pulse output driver comprises a circuit for limiting a duty cycle of the test pulse to reduce stress on the test pulse output driver.

8. The circuit of claim 7, wherein the test pulse output driver comprises:
an asynchronous delay for delaying a clock signal;
an inverter for inverting the delayed clock signal;
a NAND gate for receiving the clock signal and the delayed inverted clock signal; and
a tri-state controller for outputting the test pulse corresponding to an output from the NAND gate.

9. The circuit of claim 7, wherein the test circuit further comprises an additional pull-up resistor connecting a constant voltage source at the second voltage to the pin.

10. The circuit of claim 7, wherein a duration of the test pulse is about 3 nanoseconds.

11. The circuit of claim 1, wherein the pin is a first pin configured to supply the first voltage to the array package, and wherein a second pin connected to the first pin comprises an input-output block of the array package comprising the test circuit.

12. The circuit of claim 11, wherein the first pin is located near a corner of the array package, and the second pin is located farther from the corner than the first pin.

13. The circuit of claim 11, wherein the first pin comprises a ground pin coupled to a ground connection of the array package, and the test circuit comprises a pull-up resistor connecting the second voltage to the second pin, and wherein when the resistance at the solder joint is at the threshold value, the resistance at the solder joint is at a first ratio with respect to a resistance of the pull-up resistor, and the output of the test circuit is configured to change from ground to the voltage other than the first voltage when the resistance at the solder joint is greater than the threshold value.

14. The circuit of claim 13, wherein the test circuit further comprises an additional pull-up resistor connecting the second voltage to a trace between the first pin and the second pin.

15. The circuit of claim 11, wherein the first pin comprises a power pin coupled to a power connection of the array package, and the test circuit comprises a pull-down resistor connecting the second voltage to the second pin, and wherein when the resistance at the solder joint is at the threshold value, the resistance at the solder joint is at a first ratio with respect to a resistance of the pull-down resistor, and the output of the test circuit is configured to change from a voltage of the power connection to the voltage other than the first voltage when the resistance at the solder joint is greater than the threshold value.

16. The circuit of claim 15, wherein the pull-down resistor connects the second voltage to the second pin via a trace between the first pin and the second pin.

* * * * *